United States Patent
Barth, Jr.

(10) Patent No.: US 9,564,183 B2
(45) Date of Patent: Feb. 7, 2017

(54) SENSE AMPLIFIER HAVING A TIMING CIRCUIT FOR A PRESEARCH AND A MAIN SEARCH

(71) Applicant: Invecas, Inc., Santa Clara, CA (US)

(72) Inventor: John Edward Barth, Jr., Williston, VT (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 14/934,050

(22) Filed: Nov. 5, 2015

(65) Prior Publication Data

US 2016/0148688 A1    May 26, 2016

Related U.S. Application Data

(60) Provisional application No. 62/085,201, filed on Nov. 26, 2014.

(51) Int. Cl.
   *G11C 15/04* (2006.01)
   *G11C 7/06* (2006.01)
   *G11C 7/08* (2006.01)

(52) U.S. Cl.
   CPC ............ *G11C 7/067* (2013.01); *G11C 7/08* (2013.01); *G11C 15/04* (2013.01)

(58) Field of Classification Search
   CPC .................................................... G11C 15/04
   USPC ..................................................... 365/49.17
   See application file for complete search history.

(56) References Cited

U.S. PATENT DOCUMENTS

| | | | |
|---|---|---|---|
| 7,724,559 B2 | 5/2010 | Arsovski | |
| 2013/0326111 A1* | 12/2013 | Arsovski | G11C 15/04 365/49.17 |
| 2014/0192579 A1* | 7/2014 | Arsovski | G11C 15/04 365/49.11 |

* cited by examiner

*Primary Examiner* — Son Mai
(74) *Attorney, Agent, or Firm* — Venture Pacific Law, PC

(57) ABSTRACT

A line sense amplifier comprises: a presearch block, a main search block, and a timing circuit. The presearch block is coupled to a presearch line for sensing the presearch line. The main search block is coupled to a main line for sensing the main line. The timing circuit operates the presearch block and the main search block for charging and sensing of the presearch line and the main line. The timing circuit initiates the main search block to determine a match condition for the main line based on whether a match condition is determined for the presearch line.

19 Claims, 15 Drawing Sheets

US 9,564,183 B2

SENSE AMPLIFIER HAVING A TIMING CIRCUIT FOR A PRESEARCH AND A MAIN SEARCH

CROSS REFERENCE

This application claims priority from a provisional patent application entitled "TCAM Design Options" filed on Nov. 26, 2014 and having application No. 62/085,201. Said application is incorporated herein by reference.

FIELD OF INVENTION

The disclosure relates to a sense amplifier, and, more particularly, to a sense amplifier and methods thereof for line sensing using a presearch and a main search.

BACKGROUND

Content addressable memories ("CAMs") are commonly used in cache and other address translation systems of high speed computing systems. Ternary content addressable memories ("TCAMs") are ternary state CAM cells and are commonly used for parallel search in high performance computing systems. The unit of data stored in a TCAM bitcell is ternary, i.e., having three possible states: logic one, logic zero, and don't care state (referred to as an "X" state). To store these three states, TCAM bitcells include a pair of memory elements.

CAMs permit its memory cells to be referenced by their contents. Thus, CAMs have found use in lookup table implementations such as cache memory subsystems and are now rapidly finding use in networking system applications such as network address translation, and other applications such as pattern recognition and data compression. A valuable feature of CAMs is its ability to perform a fast search operation in which search data is compared with stored data. Typically, a searched data word is loaded onto search lines and compared with stored data words in the CAMs. The stored data words are compared bit-by-bit with the searched data word. During a search-and-compare operation, the CAMs perform a parallel search and generates match or mismatch signal associated with each stored data word, indicating whether the search word matches any of the stored data words.

FIG. 1 illustrates a prior art block diagram for TCAM unit cells connected to a match line sense amplifier. TCAM bitcells 10 that form a data entry can be connected along the same row and connected to a match line ML. The bitcells 10 can also be coupled to word lines WLY and WLX, search lines ST and SC, and bitlines BC and BT. The word lines WLY and WLX run perpendicular to bitlines BC and BT. A match line sense amplifier 20 is connected to an end of the match line. Each of the TCAM bitcells 10 comprise two static random-access memory ("SRAM") cells (or dynamic random access memory ("DRAM") cells, depending on the implementation) and a compare circuit 12 (e.g., an XOR circuit) to compare the data within the respective TCAM bitcell with bits of the searched data word.

An indication of a match or mismatch is indicated on the match line. The compare circuits 12 of the TCAM cells 10 of a stored data word can have their respective outputs logically dotted together in a dot-XOR structure via the match line. If any of the compare circuits 12 are on (i.e., driving the match line to a low state to indicate a mismatch), a mismatch can be identified for that respective stored data word. If the match line goes to a high state, then the stored data word can be identified as a match and the location of that data entry is outputted.

FIG. 2 illustrates a prior art block diagram for compare circuits of TCAM bitcells connected to a match line sense amplifier. As indicated above, the compare circuits 12 of the TCAM data entry are connected together via the match line. Due to the large number of compare circuits 12, the match line can be highly capacitive. The match line is further coupled to the match line sense amplifier 20 at one end of the match line to charge the match line and sense the voltage on the match line. Due to the charging requirement for operation, the match line can consume large amounts of power. For this reason, TCAMs require relatively high power and large current pulses to operate the compare circuits and the match line sense amplifier.

FIG. 3 illustrates a prior art circuit for a match line sense amplifier. A match line sense amplifier 30 comprises a p-channel field effect transistor ("PFET") 31 and an inverter 32. The PFET 31 is connected across the power supply Vdd and a match line. The inverter 32 inverts the signal ML of the match line to an inverted output signal OUT. The amplifier 30 has several drawbacks. First, the large voltage swing between ground and Vdd on the match line can cause large current burn off. Second, the amplifier 30 suffers from poor performance due to taking a long time to discharge the match line for single bit mismatches. Third, the search lines may also transition states for each search cycle that can cause more power burn.

FIG. 4 illustrates a prior art circuit for another match line sense amplifier from U.S. Pat. No. 7,724,559. In U.S. Pat. No. 7,724,559 (herein the "'559 patent"), the '559 patent has addressed such problems by charging the match line using an n-channel field effect transistor ("NFET") to a voltage below the power supply voltage Vdd. A self-referenced sense amplifier 40 is coupled to the match line ML of a CAM to determine the state of the match line ML. The self-referenced sense amplifier 40 includes a PFET transistor 43 coupled in series to an NFET transistor 44 to connect ML to the power supply voltage Vdd. A sensing inverter 45 is coupled to the end of ML. The output of the sensing inverter 45 is fed back to the gate of NFET 44, while the gate of PFET 43 is coupled to a PREbar signal. A sensing inverter 46 is coupled to a sense node 47 between the PFET 43 and then NFET 44 to output the $ML_{OUT}$ determination. A keeper 48 is used to maintain that voltage on the match line.

Prior to operation, ML is set low, e.g., to ground, and precharge bar PREbar is set high, e.g., to Vdd. In operation, ML is precharged to the threshold (or trigger point) of the inverter 45, and, thereafter, ML sensing occurs. To begin precharging ML from its initial low, PREbar goes low from its initial high, which turns on the PFET 43. Because ML is initially set low, the gate of NFET 44 is set high by inverter 45, turning on NFET 44, whereby current flows to begin charging ML to the threshold of inverter 45. When the voltage on ML crosses the threshold of the sensing inverter 45, the sensing inverter 45 will start discharging the gate of the NFET 44 low until the NFET 44 turns off. As a result, the sense node 47, which was originally coupled to ML through NFET 44, uses the full charge provided by PFET 43 to charge node 47 to Vdd. This causes the output of the inverter 46 to discharge low to GND. Precharge bar PREbar is subsequently disabled by a signal from a one-bit miss reference ML (not shown). Moreover, the keeper 48 can be coupled between the gate of the NFET 44 and ML. The keeper 48 is provided to maintain the precharged value to prevent leakage on ML from being misinterpreted as a mismatch.

The '559 patent precharges the match line through the NFET 44. A drawback of such match line sense amplifier is that precharging of the match line is slow since the NFET 44 is in a source follower mode, i.e., overdrive of that NFET 44 is significantly reduced when the source of the NFET 44 goes up in voltage. Furthermore, it is well known that NFETs can only pull up as far as its Vgs voltage minus a threshold voltage. In doing so, the NFET 44 can only pull up to its threshold voltage before the NFET 44 turns off. The turn off of the NFET is asymptotic, which leads to a very slow charging of the match line by the NFET. Also, the NFET does not allow for overshooting since it cannot charge above the threshold voltage of the NFET.

Additionally, the sensing inverter 45 requires a Schmitt trigger since the sensing inverter 45 does not provide enough margin to combat the sensitivity of the system which may lead to tripping back and forth by the sensing inverter 45. The Schmitt trigger provides hysteresis to keep the inverter 45 in a current state unless the input is beyond the trip point to trip back to its other state. A drawback of using such sensing inverter 45 that has the Schmitt trigger is that the inverter 45 would require more complexity, and, in particular, additional transistors for implementing the Schmitt trigger.

For the foregoing reasons, there is a need for new methods and apparatuses for a sense amplifier that is self-referencing, provide adequate overshoot of the line voltage, reduce complexity, quickly charge a line to be sensed, and/or increase performance speed.

SUMMARY OF INVENTION

Briefly, the disclosure relates to a line sense amplifier, comprising: a presearch block coupled to a presearch line for sensing the presearch line; a main search block coupled to a main line for sensing the main line; and a timing circuit to operate the presearch block and the main search block for charging and sensing of the presearch line and the main line.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. Furthermore, the following content addressable memory ("CAM") examples are meant to aid in the understanding of the present disclosure, and are not meant to limit the present disclosure in anyway. It is understood that a person having ordinary skill in the art can use the present disclosure for a variety of memory systems and for other semiconductor devices and systems that require voltage sensing on a line. For instance, a sense amplifier of the present disclosure and related methodology can be used for CAMs, single ended bit line scheme for two-port SRAMs, single ended DRAMs, cross point switches, etc.

Figure 1:
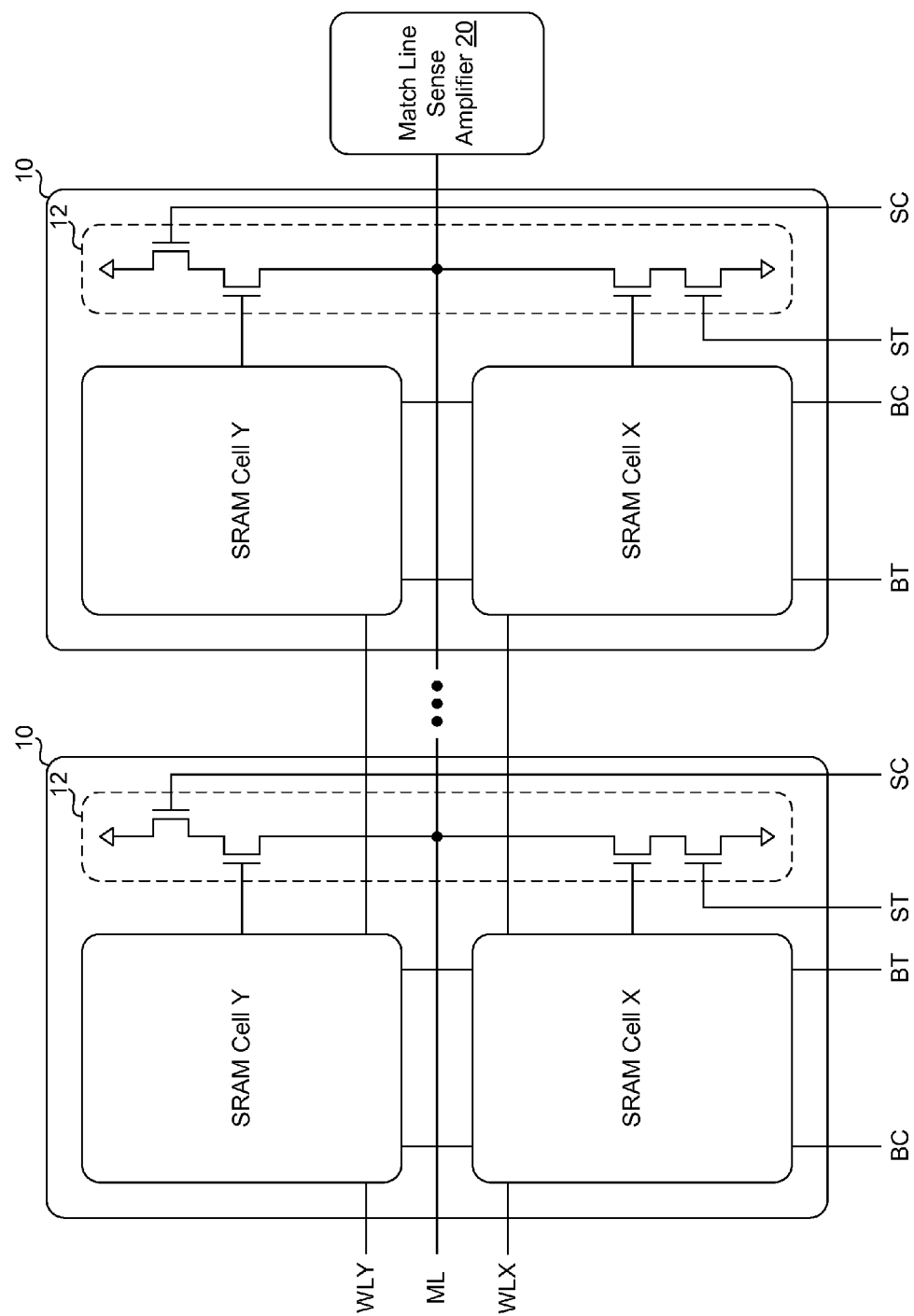
FIG. 1 illustrates a prior art block diagram for TCAM unit cells connected to a match line sense amplifier.
Figure 2:
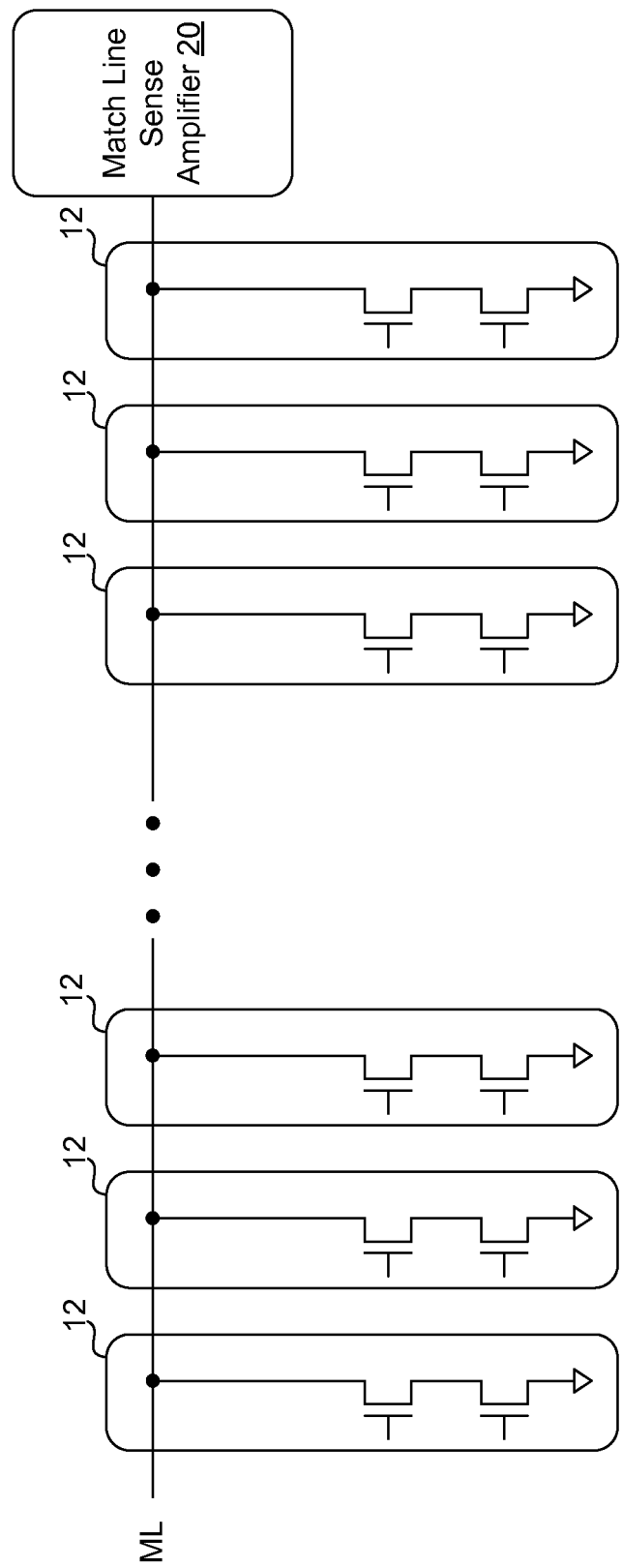
FIG. 2 illustrates a prior art block diagram for compare circuits of TCAMs connected to a match line sense amplifier.
Figure 3:
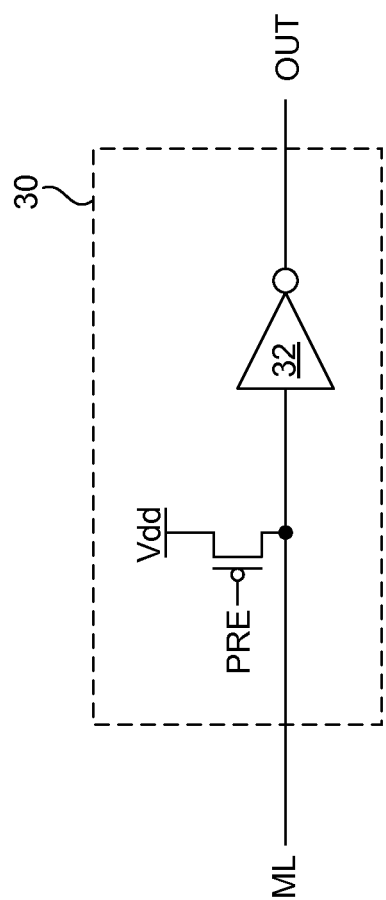
FIG. 3 illustrates a prior art circuit for a match line sense amplifier.
Figure 4:
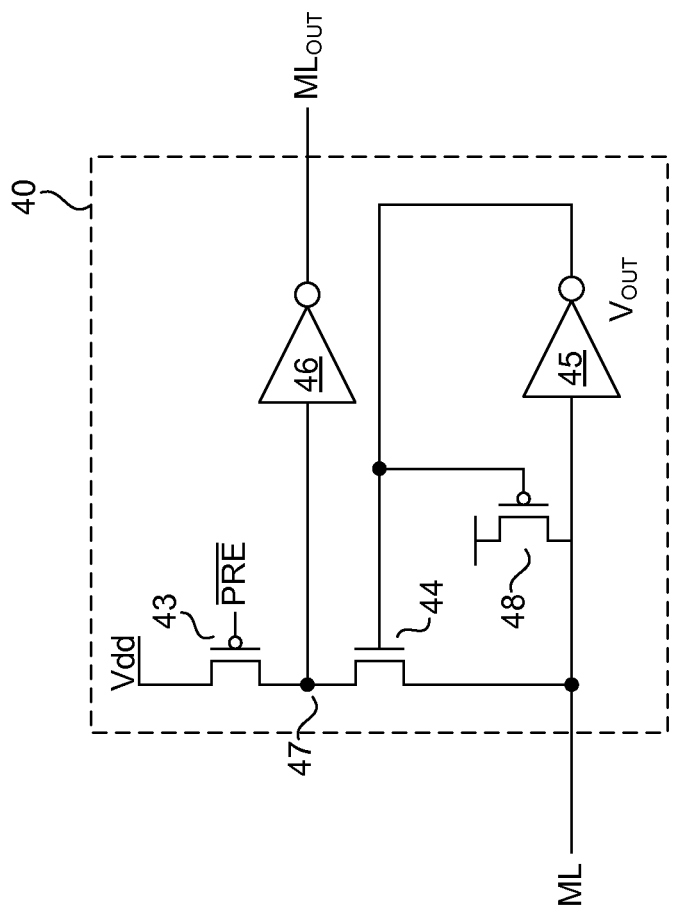
FIG. 4 illustrates a prior art circuit for another match line sense amplifier.
Figure 5A:
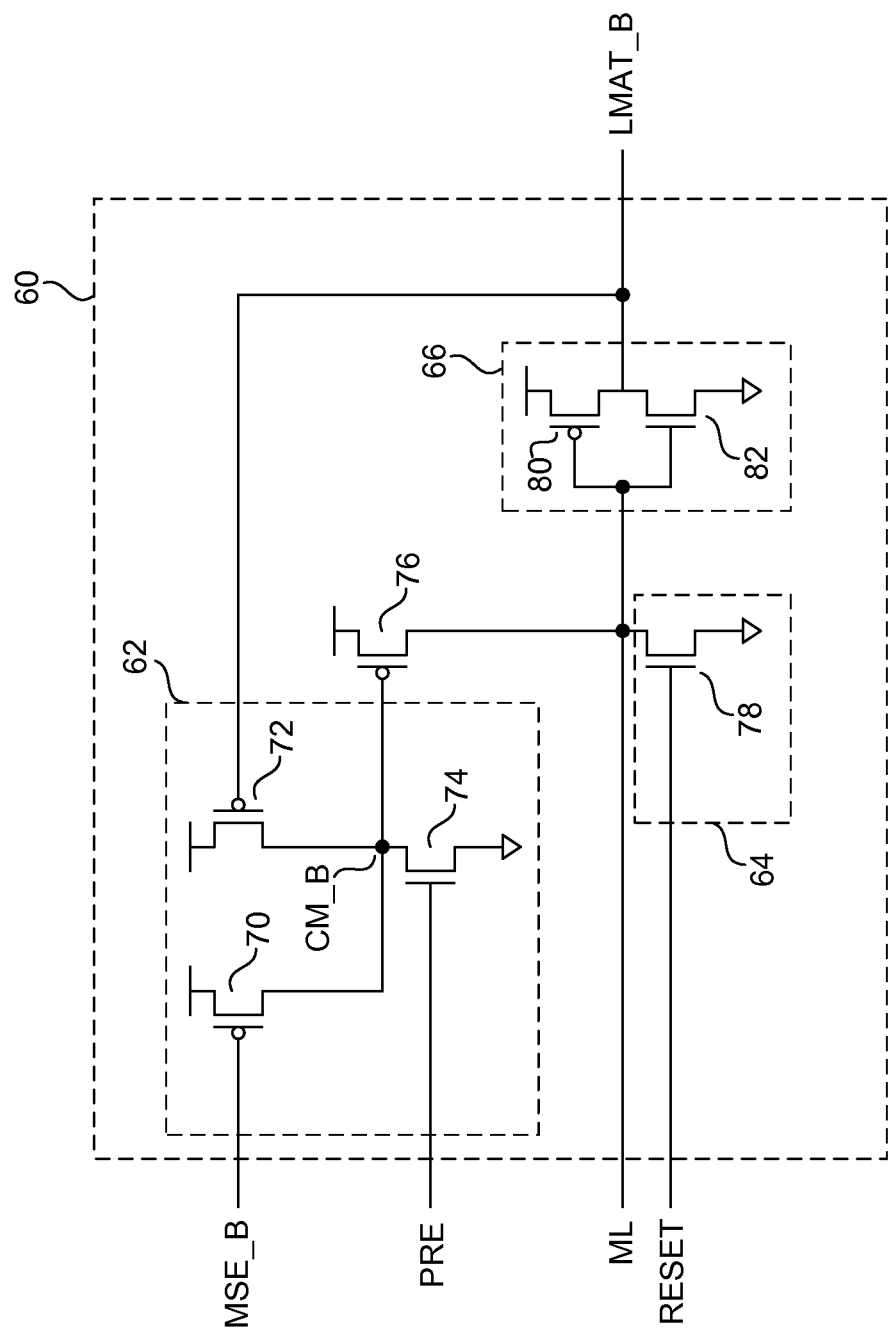
FIGS. 5a-5b illustrate circuit diagrams for sense amplifiers of the present disclosure.

FIG. 5a illustrates a circuit diagram of a sense amplifier of the present disclosure. A sense amplifier 60 for sensing a match line of a CAM comprises: a p-channel pull-up transistor 76 for charging the line; an inverter 66; a pull-up controller 62; and a reset block 64. The match line can also be a line in other semiconductor applications in which sensing is performed at an end of the line. The reset block 64 can be used to reset the match line to ground. The p-channel pull-up transistor 76, the inverter 66, and the reset block 64 are coupled to the match line. The inverter 66 can invert a line voltage ML on the match line to a signal LMAT_B as output for the sense amplifier 60. The signal LMAT_B can be fed back to the pull-up controller 62. The pull-up controller 62 is coupled to the gate of the p-channel pull-up transistor 76 for controlling the transistor 76 as a function of the inverted line voltage LMAT_B.

The pull-up controller 62 comprises p-channel field effect transistors ("PFETs") 70 and 72 and an n-channel field effect transistors ("NFET") 74. The PFETs 70 and 72 are connected across a high voltage state (e.g., a power supply voltage Vdd) and a node CM_B. The NFET 74 is connected across the node CM_B and a low voltage state (e.g., ground). The gate of the p-channel pull-up transistor is coupled to the node CM_B. The charge signal PRE can be a pulse signal to initiate the charging of the match line. A signal MSE_B is applied to the gate of the PFET 70 to terminate charging of the match line for multi-bit misses. The signal LMAT_B is fed back to the gate of the PFET 72.

The inverter 66 can comprise a PFET 80 and a NFET 82 serially connected across the power supply Vdd and ground. The gates of the PFET 80 and NFET 82 are coupled to the match line. The serial connection between the PFET 80 and the NFET 82 can provide the sense amplifier output LMAT_B. The inverter 66 can (1) determine when the match line voltage crosses a trip point from a low state below the trip point to above or at the trip point (which causes the termination of the charging) and (2) determine when the match line voltage drops from a high state above the trip point to below or at the trip point (which is used for sensing a one bit mismatch on the match line). The inverter 66 is an example of an implementation used to aid in the understanding of the invention and is not meant to limit the present disclosure in any way. It's understood that a person having ordinary skill in the art can provide other implementations for an inverter to be used in conjunction with the present disclosure.

The reset block 64 can comprise an NFET 78 connected across the match line and ground, where a reset signal RESET is applied to the gate of the NFET 78. Similarly here, the reset block 64 is an example of an implementation used to aid in the understanding of the present disclosure and is not meant to limit the present disclosure in any way. It's understood that a person having ordinary skill in the art can provide other implementations for a reset block to be used in conjunction with the present disclosure.

The match line can be initially set to ground by the reset block 64. The signal PRE can be a short pulse signal to pull the CM_B node low, which starts charging of the match line. The match line is pulled up by the PFET 76 until the inverter 66 trips. As soon as the inverter 66 trips, the charging of the match line is stopped by the pull-up controller 62. The pull-up controller 62 can comprise logic to control the gate of the PFET 76. The stoppage of the charging of the match line is not immediate since there is an inherent time delay in processing of the LMAT_B signal by the pull-up controller 62. The inherent time delay can allow for some overshoot to charge the match line to slightly above the tripping point voltage. For instance, the voltage on the match line can be overshot by 100 mV or by another predefined or self-regulated amount. The overshoot can be further configured depending on the selection of the devices of the pull-up controller 62.

As soon as the match line reaches the trip point of the inverter 66, the LMAT_B signal is fed back to the pull-up controller 62 to turn off the charging by pulling the CM_B node high. In the event of multiple mismatched cells preventing the charging of the match line above the inverter 66 trip point, the MSE_B signal turns off the charging after a predefined amount of time or by another timing scheme. The predefined amount of time can be determined by a timing circuit (e.g., a mimic circuit). In cases where there are multi-bit mismatches, the MSE_B signal is used to turn off the charging to prevent burning power.

The reset signal RESET can be active until a beginning of a search cycle, at which point the reset block 64 is turned off to begin the line charging and detection. After a cycle is completed, the reset signal RESET can be switched to a high state to ground the match line for the next search cycle.

Figure 5B:
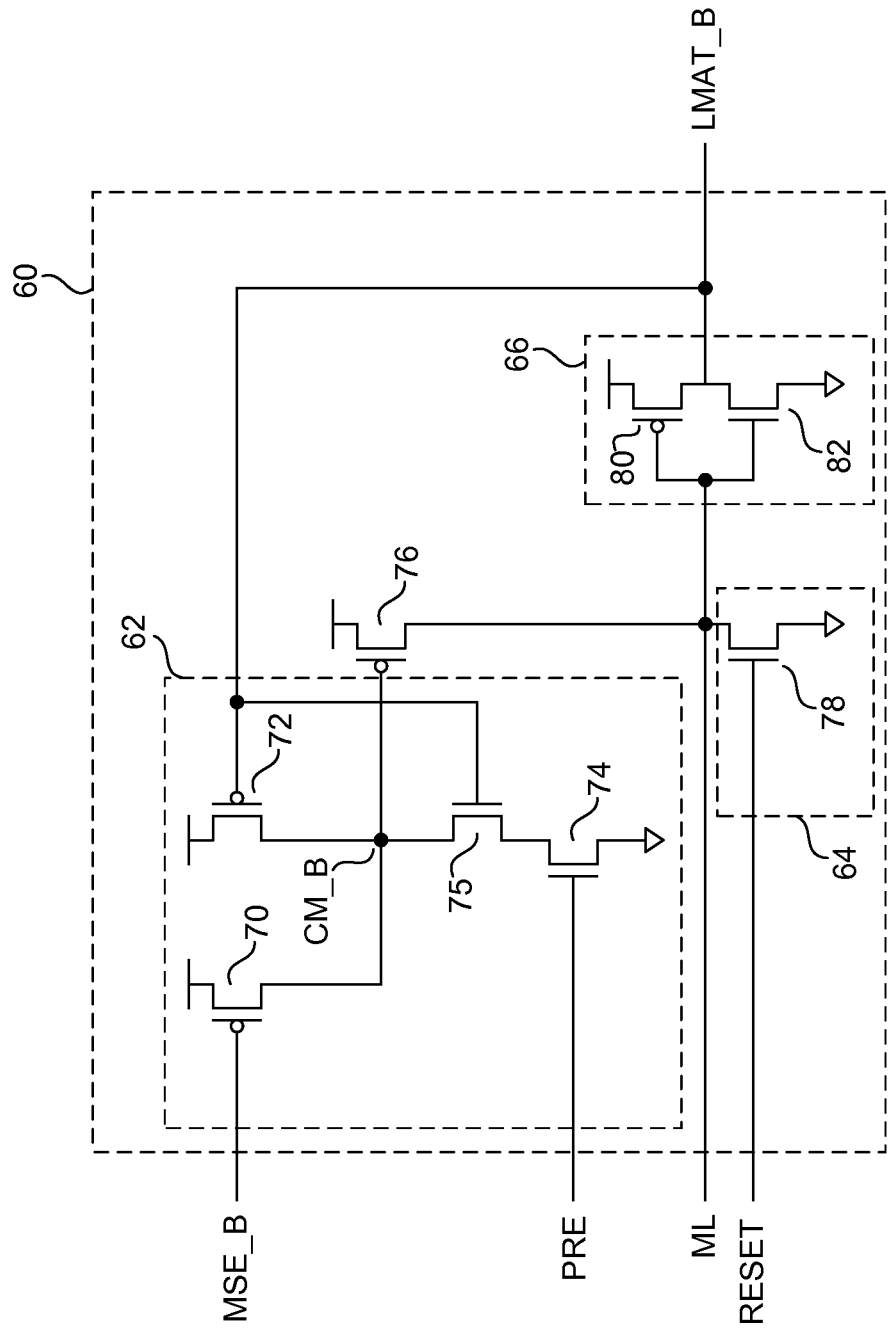

FIG. 5b illustrates another circuit diagram of a sense amplifier of the present disclosure. The pull-up controller 62 can further comprise an NFET 75 to prevent oscillations in the sense amplifier 60. The oscillations can be caused due to the match line charging up quickly, which causes the feedback signal LMAT_B to pull the CM_B node high. In such event, there is contention between the PFET 72 and the NFET 74 that may cause power burn. To prevent such power burn, the NFET 75 is serially connected to the NFET 74 across the node CM_B and ground. The gate of the NFET 75 is coupled to the feedback signal LMAT_B to break the path to the NFET 74 to prevent power burn. The charge signal PRE can be long enough so the CM_B node gets discharged through to ground, but also short enough so that the sense amplifier can detect a fast one-bit mismatch.

Figure 6:
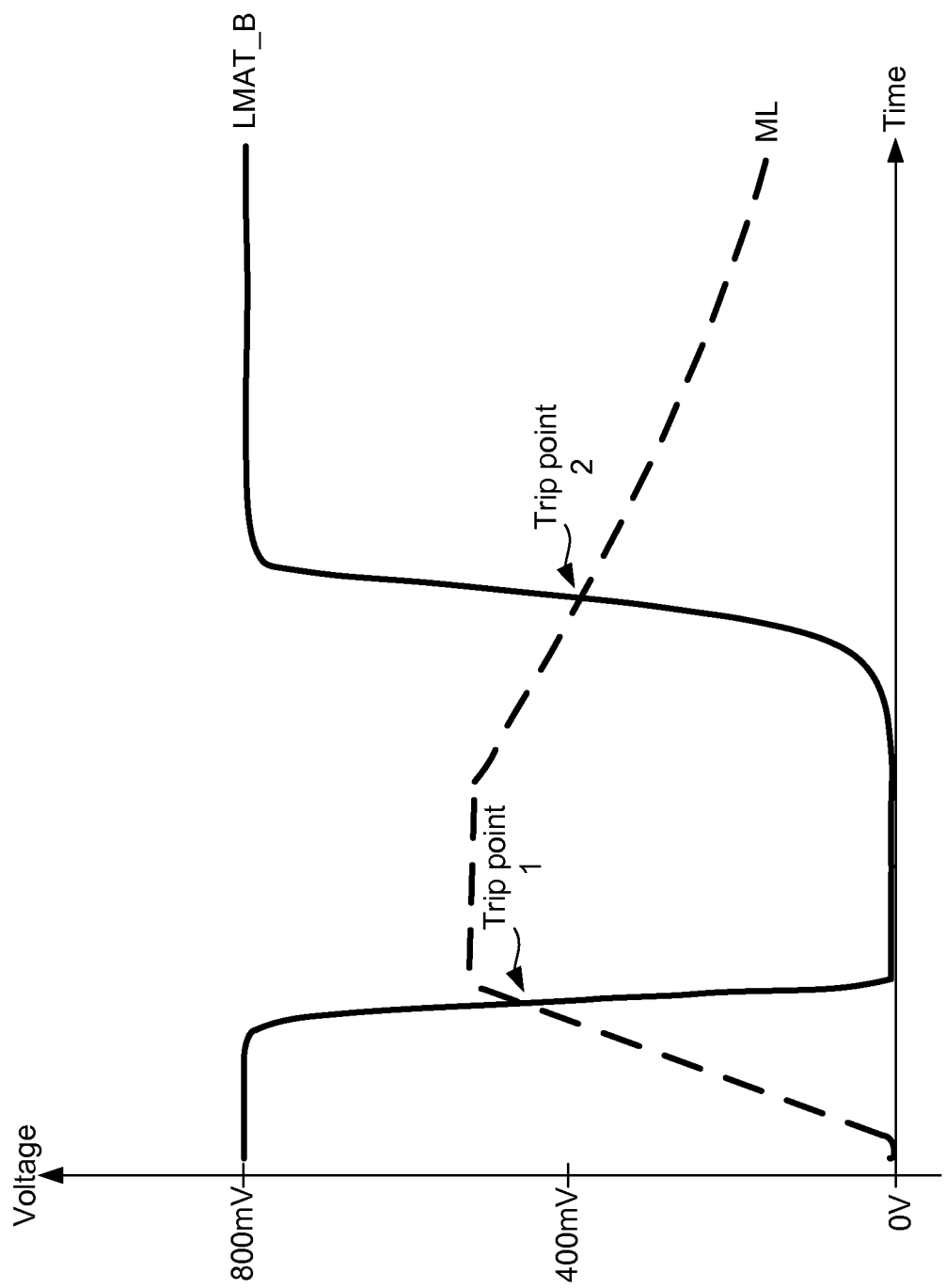
FIG. 6 illustrates a graph of a line voltage and an output of a sense amplifier of the present disclosure.

FIG. 6 illustrates a graph of a line voltage and an output of a sense amplifier of the present disclosure. The sense amplifier 60 of the present disclosure can charge a match line from ground to a trip point 1 of the inverter 66. Upon reaching the trip point 1 of the inverter 66, the feedback signal LMAT_B is fed to the pull-up controller 62 to cease charging of the match line. The inherent time delay between the feedback and the actual stoppage provides a span of time in which charging of the match line is active to charge the match line beyond the trip point 1. This can be referred to as overshooting. Overshooting the trip point can allow for a built-in hysteresis in the sense amplifier without additional circuitry to provide such hysteresis (e.g., a Schmitt trigger). The overshoot voltage above the trip point 1 can also provide a margin for error.

If any compare circuits 12 are pulling the match line, e.g., a 1-bit mismatch, or any leakage on the match line, the match line voltage ML will drop. The line voltage ML will eventually pass through a trip point 2, which triggers the LMAT_B signal to switch from a low voltage state to a high voltage state. Since the match line was charged to a value just above the trip point, the LMAT_B signal switching can occur earlier than if the match line was charged to an even higher voltage of Vdd (or 800 mV in this example). The sense amplifier of the present disclosure can use this earlier trip point to make faster determinations on matches or mismatches than other sense amplifiers that charge the match line to Vdd. Furthermore, less power is consumed since the match line does not have to be charged to Vdd. It should be noted that that charge up is very rapid and almost linear, providing for high performance charging which reduces power burning time of multi-bit mismatches.

Figure 7:
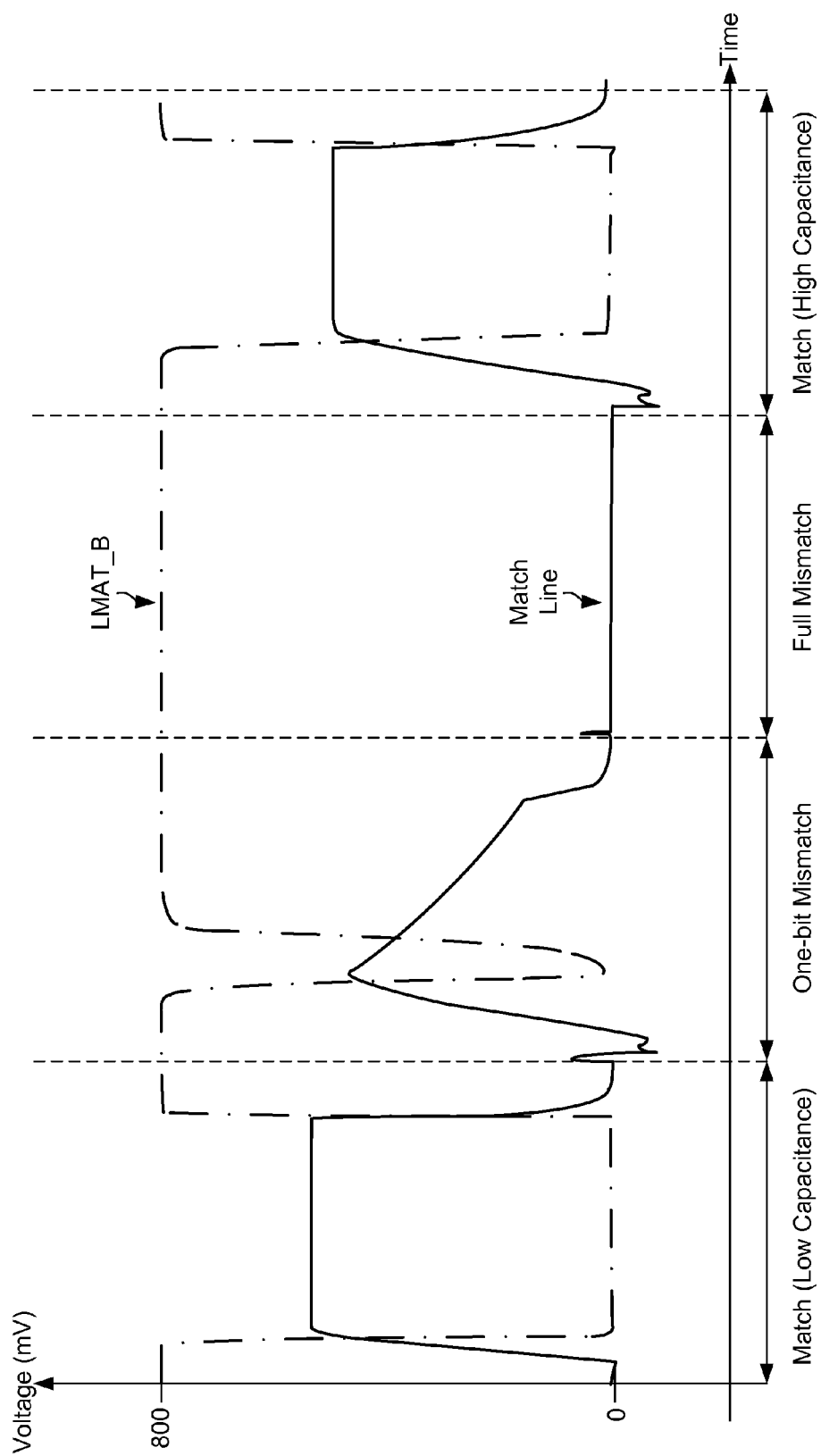
FIG. 7 illustrates a graph of a line voltage and a line sense amplifier output using circuits and methods of the present disclosure.

FIG. 7 illustrates a graph of a line voltage and a line sense amplifier output using circuits and methods of the present disclosure. A sense amplifier of the present disclosure can determine several match line voltage characteristics, including a match on a low capacitance match line, a one-bit mismatch, a full mismatch, and a match on a high capacitance match line.

In a scenario where there is a match on a low capacitance match line, the match line is charged to a level just above the trip point of the inverter of the sense amplifier. Upon reaching the trip point, the LMAT_B signal switches from a high voltage state to a low voltage state. The match can pull the match line voltage upwards toward Vdd. Once a predetermined amount of time has passed, the LMAT_B signal remains low indicating a match. After a match is detected, the match line is reset to ground, causing the LMAT_B signal to switch from low to high upon crossing the trip point of the inverter of the sense amplifier.

In another scenario where there is a 1-bit mismatch on a match line (i.e., when one of the compare circuits indicates a mismatch and the remainder compare circuits indicates a match), the LMAT_B signal is in a high state and the match line voltage is in a low state. The match line voltage is charged by the sense amplifier until it reaches the trip point of the inverter of the sense amplifier. At this time, the LMAT_B signal switches from the high state to the low state and the sense amplifier shuts off the charging, but not before the match line voltage increases an amount above the trip point of the inverter. At this point, the certain one of the compare circuits indicating the mismatch can slowly drive the match line voltage to the low state (i.e., ground).

Consequently, the match line voltage gets pulled down past the trip point. Once the match line voltage passes the trip point, the LMAT_B signal switches from the low state to the high state to indicate a mismatch.

In yet another scenario where all the compare circuits along the match line indicate a mismatch (i.e., a full mismatch), the compare circuits will drive the match line signal to ground keeping the match line voltage near ground and the LMAT_B signal in a high state. Charging of the match line by the sense amplifier is not noticeable since the pulling of the match line to ground by all of the compare circuits overwhelms any increase by the sense amplifier. Thus, charging of the match line by the sense amplifier can be disabled to prevent current burn. After a predetermined amount of time, the LMAT_B signal is still high indicating a mismatch. After the mismatch is detected, the match line can be reset to begin the next cycle.

In yet another scenario, a match on a high capacitance line can be determined. This is similar to the first scenario except that the match line here has a higher capacitance than in the first scenario. In such scenario of a higher capacitance, the match line voltage is driven high but more slowly than in the first scenario and not as high. Once a predetermined amount of time has passed, the LMAT_B signal remains low indicating a match. After the match is detected, the match line is reset to ground, causing the LMAT_B signal to switch from low to high upon crossing the trip point of the inverter of the sense amplifier. The lower charging level is acceptable because leakage will take longer to move a high capacitance ML. Additionally, the lower voltage is advantageous for a 1-bit mismatch due to the lower starting voltage.

Figure 8:
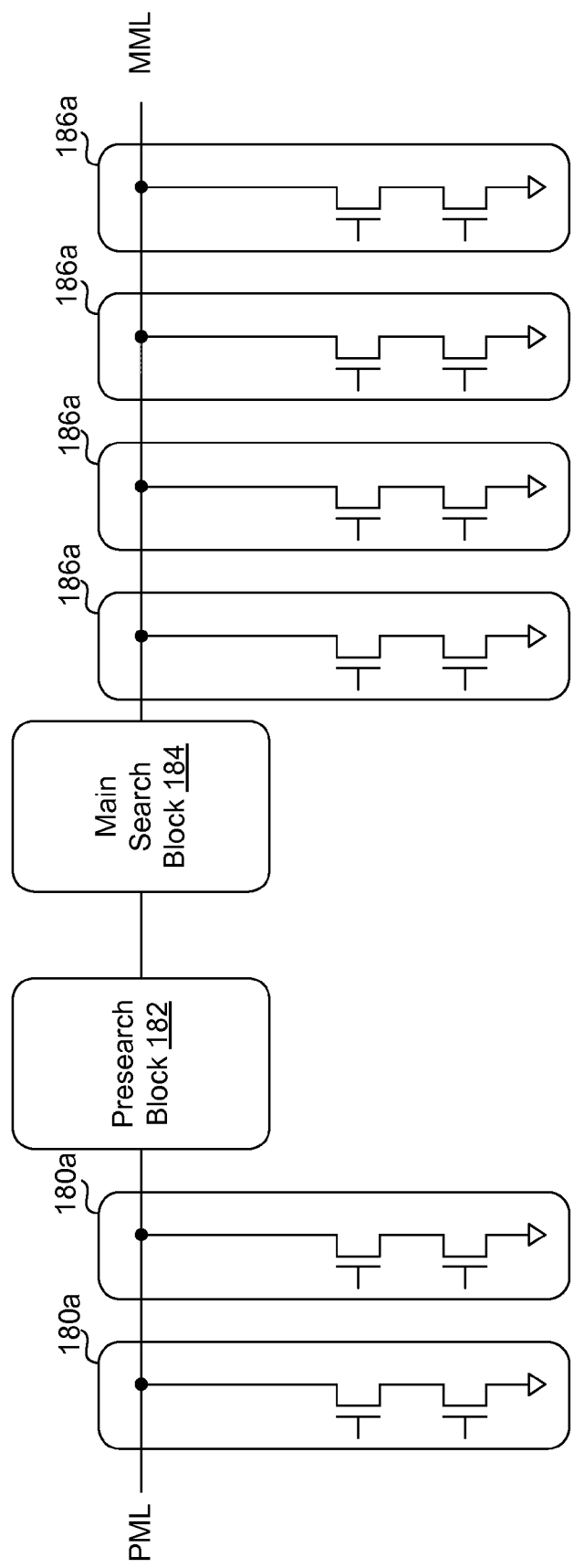
FIG. 8 illustrates a block diagram of a line sense amplifier of the present disclosure having a presearch block connected to a presearch match line and a main search block connected to a main match line.

FIG. 8 illustrates a block diagram of a line sense amplifier of the present disclosure having a presearch block connected to a presearch match line and a main search block connected to a main match line. Generally, a TCAM has a plurality of match lines, where each match line is connected to a stored TCAM data word. A data word search can search the match lines to determine which match lines are connected to a matching data word. Since every bit of the data word must match, a presearch can be performed on a subset of bits of the stored data word on a presearch match line. The match lines that return a presearch match can be further searched in a main search of the match lines, i.e., the remainder bit cells coupled to the main match lines. The match lines that return a presearch mismatch do not need to be charged, resulting in significant power savings.

Referring to FIG. 8, a predefined number of bitcells of a stored data word can be searched by connecting their respective compare circuits 180a to a presearch match line. The presearch match line is connected to a presearch block 182. Assuming that there is a match between the predefined number of bitcells of the data word and the search word, the presearch block 182 can enable the main search block 184 to search the remainder of the bitcells of the data word via the compare circuits 186a on the main match line. The presearch match line and the main match line can be initially grounded to prevent current burn off. The presearch match line can be charged once the presearch is enabled. When the presearch block 182 enables the main search block 184, charging of the main search block can begin.

Figure 9A:
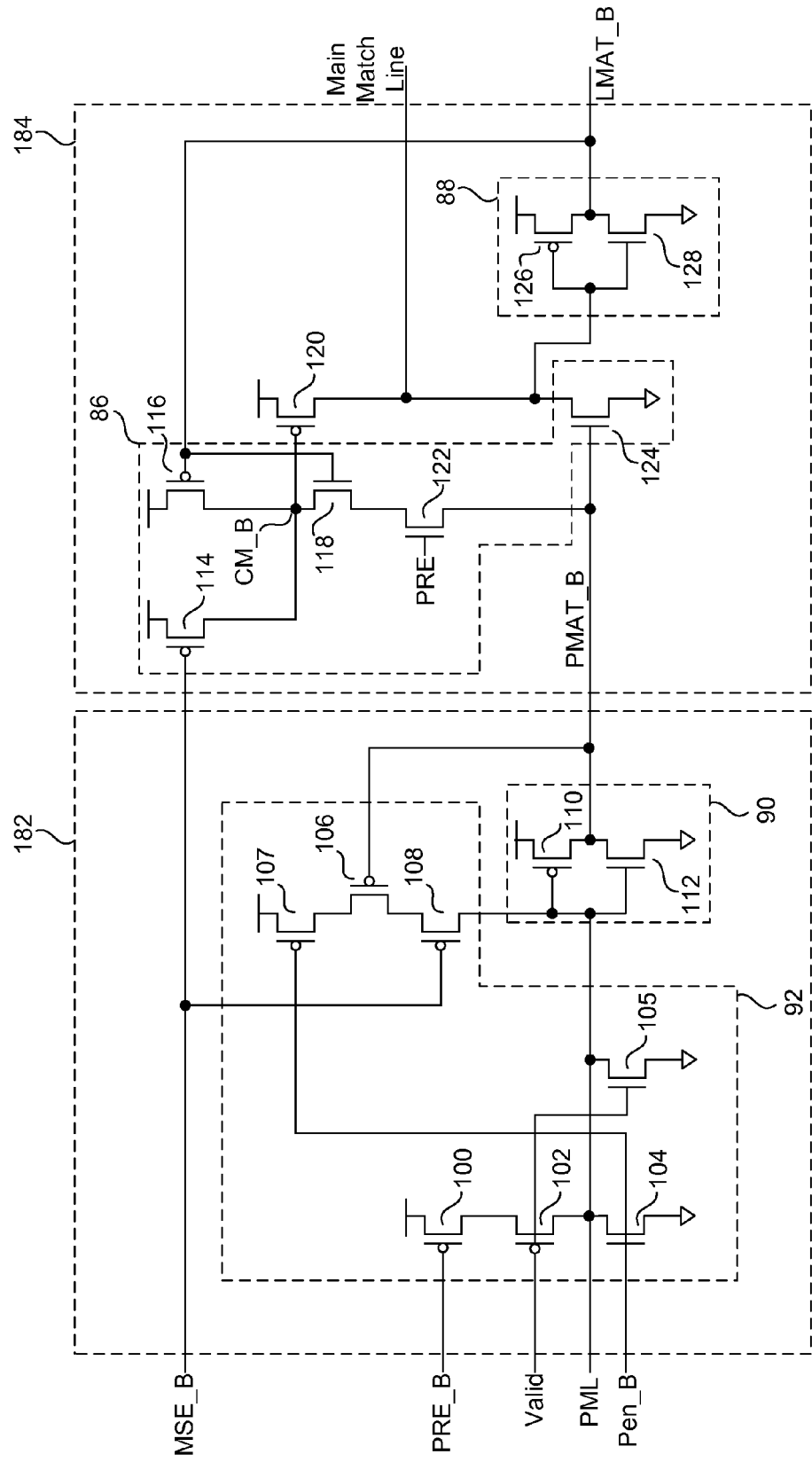
FIGS. 9a-9b illustrate circuit diagrams of sense amplifiers of the present disclosure having a presearch block and a main search block.

FIG. 9a illustrates a circuit diagram of a line sense amplifier of the present disclosure having a presearch block and a main search block. A line sense amplifier of the present disclosure comprises a presearch block 182 and a main search block 184. The presearch block 182 comprises an inverter 90 and a presearch controller 92. The inverter 90 can comprise a PFET 110 and an NFET 112 serially connected across Vdd and ground. The gates of the PFET 110 and NFET 112 are coupled to the presearch match line. A voltage on the presearch match line can be denoted PML. The serial connection between the PFET 110 and the NFET 112 can provide the presearch block output PMAT_B. The PMAT_B signal can be used to indicate if there is a presearch match or mismatch. When the PMAT_B signal is low, then that can be an indication of a match. When the PMAT_B signal is high, then that can be an indication of a mismatch. The inverter 90 is an example of an implementation used to aid in the understanding of the present disclosure and is not meant to limit the present disclosure in any way. It's understood that a person having ordinary skill in the art can provide other implementations for an inverter to be used in conjunction with the present disclosure.

The presearch controller 92 comprises PFETs 100, 102, and 106-108 and NFETs 104 and 105. The PFETs 100 and 102 and NFET 104 are serially connected across Vdd and ground. The NFETs 104 and 105 are connected in parallel across the presearch match line and ground. The PFETs 107, 106, and 108 are serially connected across Vdd and the presearch match line. The presearch match line can be further connected to a predefined number of CAM cells (not shown) to perform a presearch on those CAM cells. The predefined number can be far less in number than the CAM cells connected to the main match line to increase power savings and performance of the respective CAM device. For instance, assuming the presearch match line has 5 CAM cells connected to it and there are 155 CAM cells connected to the main match line, then, on average, match line activations can be reduced to $\frac{1}{32}$ of the total match line activations. Thereby, an immense power saving is accomplished.

A charge disable signal MSE_B can be inputted to the gate of the PFET 108 and the main search block 184 to disable charging for multi-bit mismatches. In particular, when the MSE_B signal is in a low state, charging on the main match line is disabled. A charge pulse signal PRE_B is applied to the gate of the PFET 100. A valid signal is applied to the gate of the PFET 102 and the gate of the NFET 105. A presearch enable signal Pen_B is applied to the gate of the NFET 104 and the gate of the PFET 107. The gate of the PFET 106 is coupled to the output of the presearch block PMAT_B.

The main search block 184 for sensing the main match line comprises: a p-channel pull-up transistor 120 for charging the main match line; an inverter 88; and a pull-up controller 86. The main match line can also be a line in other semiconductor applications in which sensing is performed at an end of the line. The p-channel pull-up transistor 120, the inverter 88, and the pull-up controller 86 are coupled to the main match line. The inverter 88 can invert a line voltage on the main match line to a signal LMAT_B as output for the main search block 184. The LMAT_B signal can be used to indicate if there is a main search match or mismatch. When the LMAT_B signal is low, then that can be an indication of a match. When the LMAT_B signal is high, then that can be an indication of a mismatch. The signal LMAT_B can be fed back to the pull-up controller 86. The pull-up controller 86 is coupled to the gate of the p-channel pull-up transistor 120 for controlling the transistor 120 as a function of the inverted line voltage LMAT_B and the output PMAT_B of the presearch block 182.

The pull-up controller 86 comprises PFETs 114 and 116 and NFETs 118, 122, and 124. The PFETs 114 and 116 are connected in parallel across a high voltage state (e.g., power supply voltage Vdd) and a node CM_B. The NFETs 118 and 122 are serially connected across the node CM_B and PMAT_B. The charge signal PRE can be a pulse signal to initiate the charging of the match line, which is applied to the gate of the NFET 122. The signal MSE_B is applied to the gate of the PFET 114. The signal LMAT_B is fed back to the gate of the PFET 116 and the gate of the NFET 118. The NFET 124 and the pull-up transistor PFET 120 are serially connected across Vdd and ground, where the connection between the two is coupled to the main match line. The gate of the pull-up transistor 120 is coupled to the node CM_B. The signal PMAT_B is applied to the gate of the NFET 124.

The inverter 88 can comprise a PFET 126 and an NFET 128 serially connected across the power supply Vdd and ground. The gates of the PFET 126 and NFET 128 are coupled to the main match line. The serial connection between the PFET 126 and the NFET 128 can provide the main search block output LMAT_B. The inverter 88 is an example of an implementation used to aid in the understanding of the invention and is not meant to limit the present disclosure in any way. It's understood that a person having ordinary skill in the art can provide other implementations for an inverter to be used in conjunction with the present disclosure.

Figure 9B:
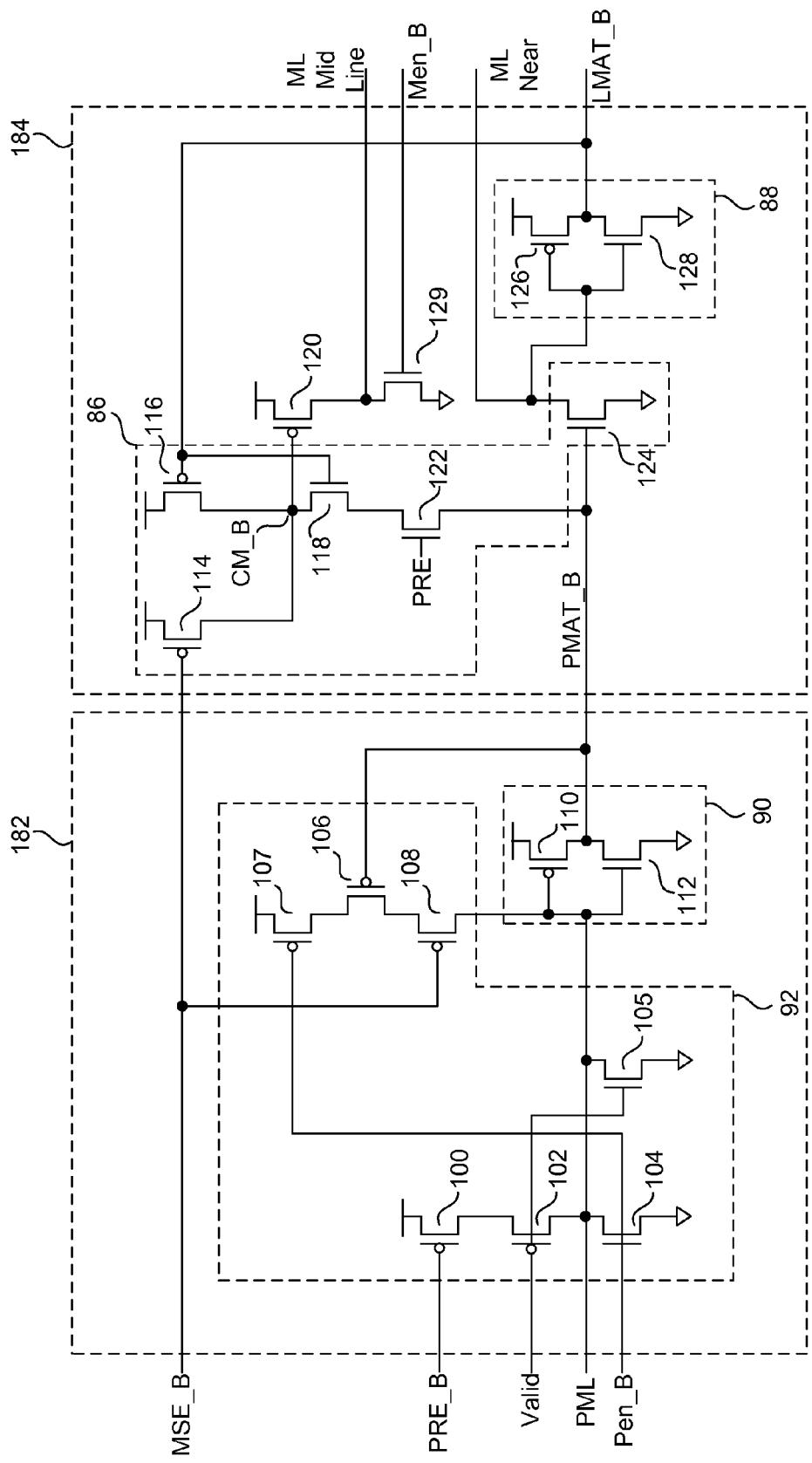

FIG. 9b illustrates a circuit diagram of a line sense amplifier of the present disclosure having a presearch block and a main search block. The line sense amplifier of the present disclosure comprises the presearch block 182 and the main search block 184. To prevent unwanted snap back along the main match line, the charging of the match line can be performed mid-line on the match line and the sensing can be performed at an end of the match line. The mid-line of the match line can be a physical point that is located about halfway of the length of the match line.

The main search block 184 can have an embodiment to support such features. Referring to FIG. 9b, the main search block 184 further comprises an NFET 129. The pull-up transistor 120 and the NFET 129 are serially connected across the voltage Vdd and ground, where that connection is coupled to around the mid-line of the match line. Thus, if charging is enabled then around the mid-line of the main match line is charged. A trace can be routed from the main search block 184 to the mid-line of the main match line to charge that point of the main match line. An end of the main match line is coupled to the NFET 124 and to the inverter 88 for sensing of the main match line at one end of the match line. In this manner, sensing and charging of the main match line can be performed at different points along the main match line to prevent snap back of the voltage along the main match line.

A person having ordinary skill in the art can move the charging point and the sensing point along the main match line in accordance with the present disclosure. Other variations as to locations of the charging location and the sensing location along the match line are apparent from the present disclosure. Therefore, other variations of locations for charging and for sensing by a sense amplifier are included in the scope of the present disclosure. For instance, rather than charging at the mid-line of the match line by the sense amplifier, charging can be at the opposite end from the sensing by the sense amplifier. Thus, the sense amplifier can provide a trace that spans from its location to the other end of the match line to charge that other end of the match line.

Figure 10:
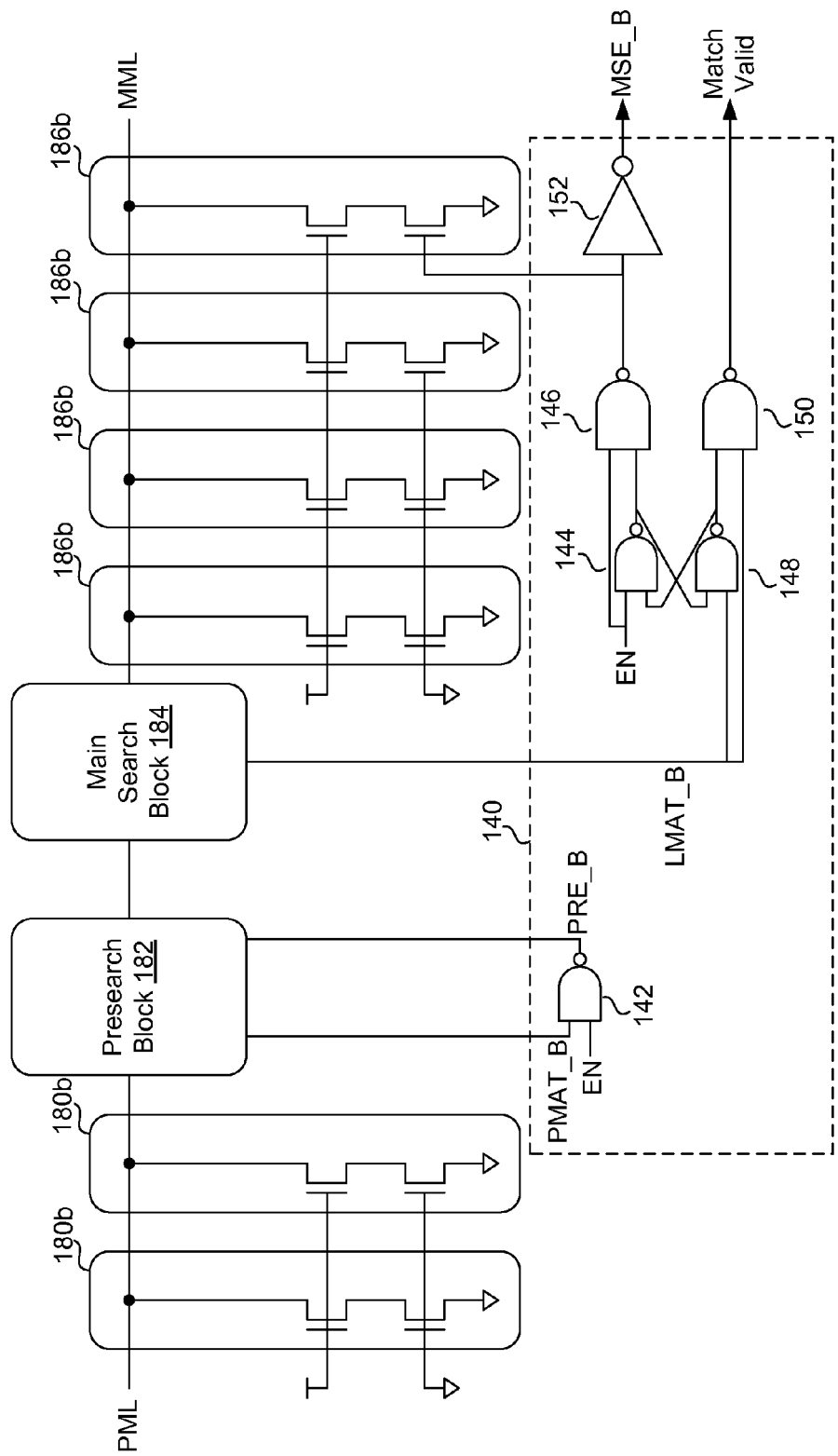
FIG. 10 illustrates a a block diagram of a line sense amplifier of the present disclosure having a timing circuitry (also referred to as a "mimic circuit").

FIG. 10 illustrates a block diagram of a line sense amplifier of the present disclosure having a timing circuitry (also referred to as a "mimic circuit"). A sense amplifier of the present disclosure can further comprise a timing circuit 140 to provide timing signals to the presearch block 182 and the main search block 184.

The timing circuit 140 comprises NAND gates 142-152. The PMAT_B signal and the EN signal are inputted to the NAND gate 142. The PRE_B signal is outputted from the NAND gate 142 to the presearch block 182. The LMAT_B signal from the main search block is inputted to the NAND gate 148 and 150, while the enable signal EN is inputted to the NAND gate 144 and 146. The output of the NAND gate 144 is inputted to the NAND gate 146 and the NAND gate 148. The output of the NAND gate 148 is inputted to the NAND gate 144 and the NAND gate 150. The NAND gates 144 and 148 form a set reset latch to capture and hold the mimic match line's upward transition through the trip point to create a MSE signal timing to terminate charging of all match lines that may not have transitioned through their respective trip point due to a multi-bit mismatch over powering the charging PFET 120 in the main search block 184.

The output signal MSE of the NAND gate 146 is inputted to a stack of the compare circuits 186b to mimic a one-bit mismatch while the other compare circuits 180b and 186b are programmed for a match. The MSE signal is also inputted to the inverter 152 to generate the MSE_B signal. Once the one-bit mismatch on the mimic circuitry is triggered, the match/mismatch cycle can end since the main search block should have had enough time to sense a match or mismatch on the main match line. Furthermore, the NAND gate 150 outputs a match valid signal, which is used to latch data from the output of the main search block 184.

The number of presearch bits for the presearch by the presearch block 182 can be configurable. The timing circuit 140 can provide adequate timing for a selected number of presearch bits to perform the steps of sensing on the presearch match line, including time to charge the presearch match line and so forth. Generally, the greater the number of presearch bits, the longer the time needed for charging, and vice versa. The compare circuits 180b and 186b can be configured to replicate such presearch bits and to determine how much timing is necessary. With that information, actual sensing on presearch match lines and main match lines for a respective CAM device can be performed. The presearch charging can be terminated once the mimic circuit 140 has completed its mimic of the presearch.

Assuming the presearch finds a match, the main match line can be charged. As the main match line begins to charge, the mimic circuit 140 can be configured to be in a match scenario. One bit is initially set to match, once the main match line reaches the trip point of the inverter the LMAT_B signal of the mimic will go low and then set the cross-coupled NAND gates 144-150 to turn on a one-bit mismatch. The one-bit mismatch will pull down the mimic main match line pass the trip point of the inverter of the main search block. Once it passes through the trip point, the LMAT_B signal will go high, which will complete the search cycle and latch any data. Next, the reset process can begin.

The mimic array the data state of the TCAM bit cells can be programmed to always be in a matching state independent of the searched data to initiate this programming. The mimic circuit 140 is always slower than a one-bit mismatch to guarantee that there will be enough time to perform the match or mismatch. The bit cells used by the mimic circuit 140 can be in the same array as the CAM bitcell arrays.

It is understood that the timing circuit 140 can provide timing to a variety of other sense amplifiers, including the sense amplifier depicted in FIGS. 5a-5b. For instance, in such case, the timing circuit may comprise NAND gates 144-152 to control the timing of the signals for the sense amplifier 60. The following example is not meant to limit the present disclosure in any way to the sense amplifier having a presearch and main search blocks. A person having ordinary skill in the art can appreciate the timing circuit can be adapted to such various sense amplifiers.

Figure 11:
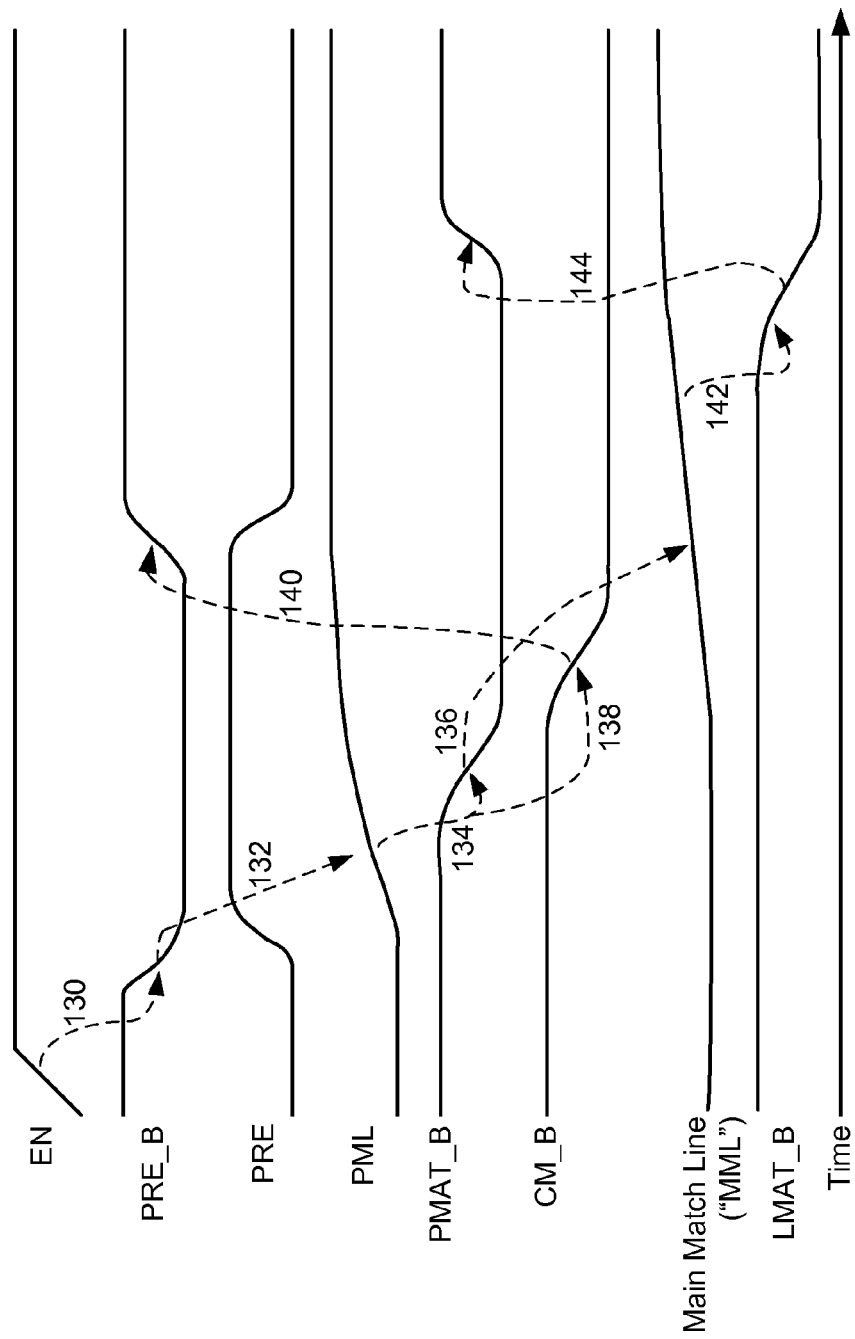
FIG. 11 illustrates a graph having signals for line sense amplifier of the present disclosure.

FIG. 11 illustrates a graph having signals for line sense amplifier of the present disclosure. To aid in the understanding of the present disclosures, the signal names that have a "_B" indicates that those signals are active when in a low state and can also be an inverse of that signal name without "_B". Initially at the beginning of a search cycle, a signal En can be driven high from a low state to initiate the presearch and charging. Search data is also applied on the search lines.

When the signal En switches to a high state, the Pre_B signal is switched from a high state to a low state 130. The Pre_B signal going low initiates the charging of the PML 132. When the PML signal reaches a tripping point, two further signals are affected. First, the PMAT_B signal switches from a high state to a low state 134 as a result of pre-search match. The switching of the PMAT_B signal causes the charging of the main match line 136. Second, the charged match line signal CM_B is discharged to a low state 138. When the CM_B signal in the mimic match line sense amp goes low as a result of the presearch, the Pre_B signal is switched from the low state to the high state 140. As the main match line is charging, the main match line will reach a tripping point at which time the LMAT_B signal will switch from a high state to a low state 142. This in turn will switch the CM_B signal from the low state to the high state 144 via the pull up controller which terminates the charge of the main match line.

Figure 12:
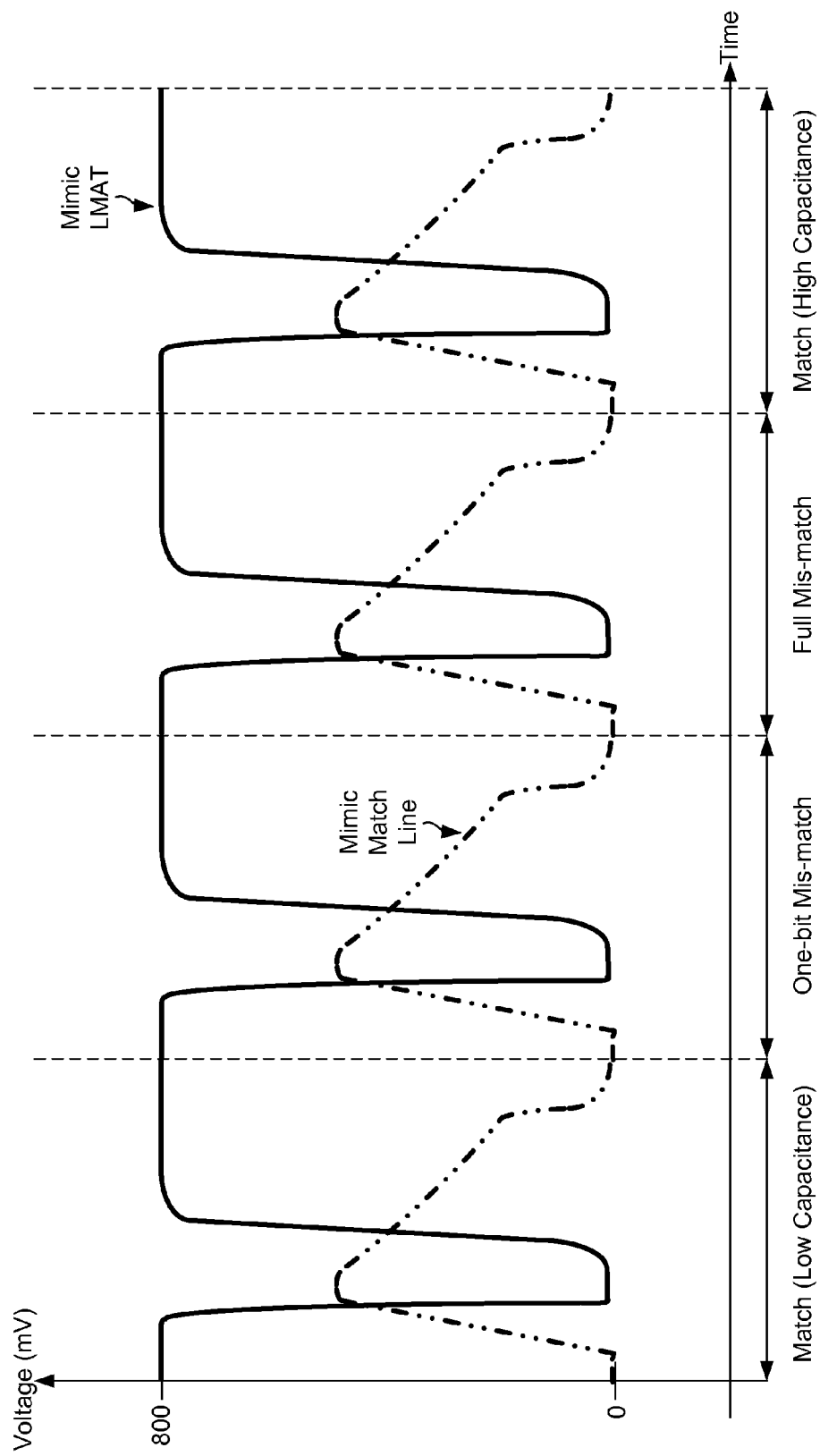
FIG. 12 illustrates a graph of a mimic line voltage and a mimic line sense amplifier output using circuits and methods of the present disclosure.

FIG. 12 illustrates a graph of a line voltage and a line sense amplifier output using circuits and methods of the present disclosure. The timing circuit 140 will mimic a 1-bit mismatch every phase regardless of the actual sensed match line by the sense amplifier. Thus, regardless of the full match, one-bit mismatch, or full mismatch on the actual compare circuits of the CAM cells, the timing circuit 140 will be reset each phase for the start of the next sensing for the actual compare circuits of the CAMs.

Figure 13:
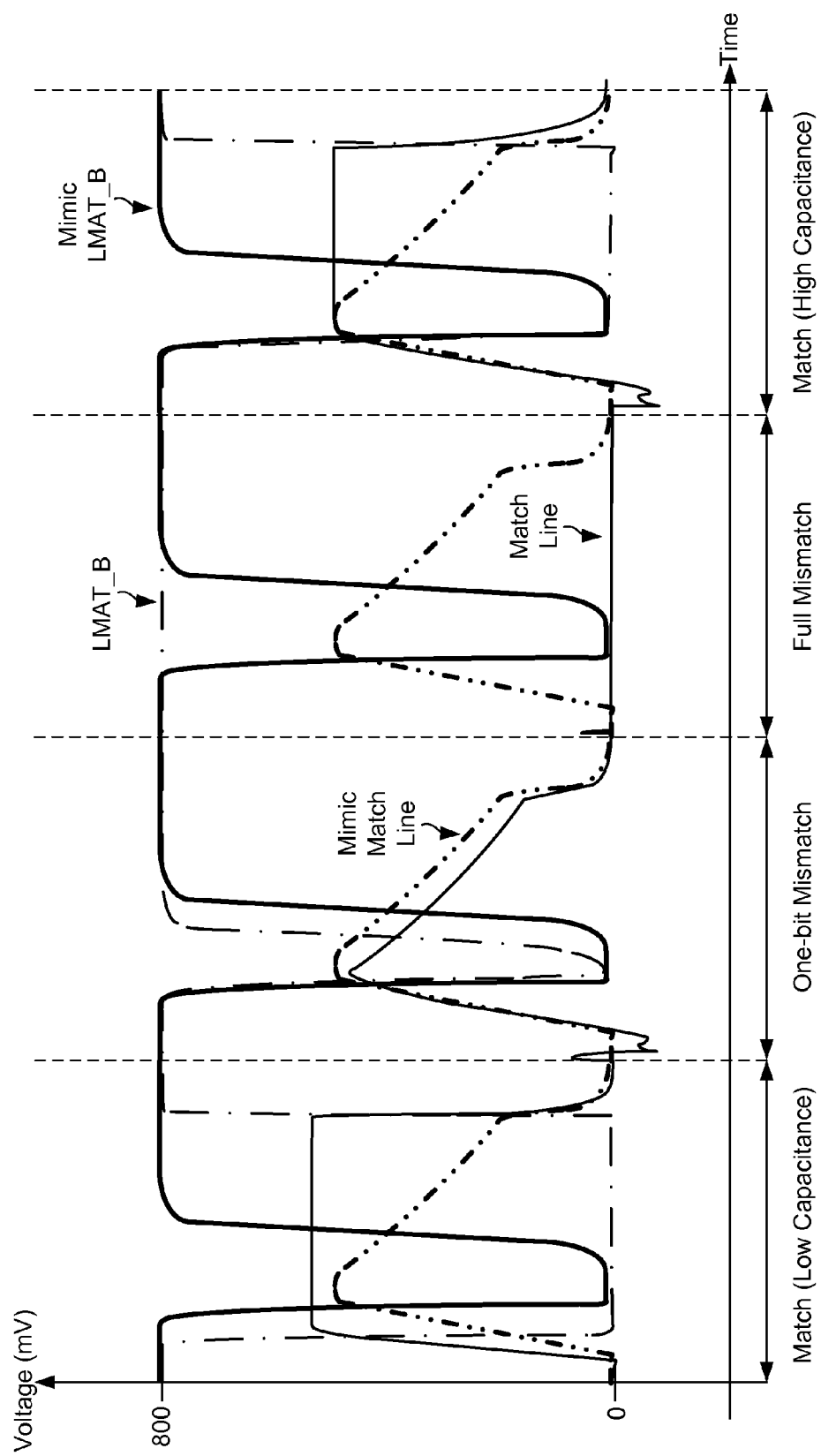
FIG. 13 illustrates another graph of line voltages and line sense amplifier outputs using circuits and methods of the present disclosure.

FIG. 13 illustrates a graph of line voltages and line sense amplifier outputs using circuits and methods of the present disclosure. In this figure, the mimic circuitry is plotted alongside the actual compare circuits of the CAMs. The LMAT_B and match line voltages can be seen to vary due to the match or mismatch scenario presented, while the mimic match line voltage and the mimic LMAT_B voltage is the same shape for each scenario.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

I claim:

1. A line sense amplifier, comprising:
   a presearch block coupled to a presearch line for sensing the presearch line;
   a main search block coupled to a main line for sensing the main line; and
   a timing circuit to operate the presearch block and the main search block for charging and sensing of the presearch line and the main line,
   wherein the presearch block comprises:
      a presearch controller for setting the presearch line to a voltage state; and
      an inverter for sensing the presearch line and for providing a feedback ("PMAT_B") to the presearch controller, and
   wherein the feedback is provided to the main search block and the timing circuit.

2. The line sense amplifier of claim 1 wherein the presearch controller comprises:
   a first branch having a first p-channel transistor, a second p-channel transistor, and a first n-channel transistor serially connected across a high voltage and a low voltage;
   a second branch having a third p-channel transistor, a fourth p-channel transistor, and a fifth p-channel transistor serially connected across the high voltage and the presearch line; and
   a second n-channel transistor,
   wherein the first n-channel transistor and the second n-channel transistor are connected in parallel across the presearch line and the low voltage.

3. The line sense amplifier of claim 2 wherein a main search enable signal ("MSE_B") is coupled to a gate of the fifth p-channel transistor, wherein a charge signal for the presearch line ("Pre_B") is coupled to a gate of the first p-channel transistor, wherein a valid signal is coupled to gates of the second p-channel transistor and the second n-channel transistor, a presearch enable signal ("Pen_B") is coupled to gates of the first n-channel transistor and the third p-channel transistor, and wherein a gate of the fourth p-channel transistor is coupled to the feedback of the presearch block.

4. The line sense amplifier of claim 1 wherein the main search block comprises:
   a p-channel pull-up transistor for charging the main line;
   an inverter for inverting a line voltage on the main line; and
   a pull-up controller,
   wherein the inverted main line voltage is feedback to the pull-up controller and outputted to provide an indication of the main line voltage;
   wherein the p-channel pull-up transistor and the inverter are coupled to the main line, and wherein the pull-up controller has an output coupled to the gate of the p-channel pull-up transistor.

5. The sense amplifier of claim 4 wherein the pull-up controller comprises,
   a first p-channel transistor having a gate connected to a main search enable signal ("MSE_B");
   a second p-channel transistor having a gate connected to an inverted line voltage ("LMAT_B");
   a first n-channel transistor having a gate connected to a charge enable signal ("PRE"); and
   a second n-channel transistor having a gate connected to the inverted line voltage,
   a third n-channel transistor having a gate connected to the feedback PMAT_B of the presearch block,
   wherein the first n-channel transistor and the second n-channel transistor are serially connected across a node CM_B and the feedback PMAT_B, wherein node CM_B is coupled to the gate of the p-channel pull-up transistor and ground, wherein the sources of the first and second p-channel transistors are connected to a high voltage state ("VDD"), and wherein the drains of the first and second p-channel transistors are connected to the gate of the p-channel pull-up transistor via the node CM_B.

6. The sense amplifier of claim 5 wherein the pull-up transistor and the third n-channel transistor are serially connected, and wherein the main line and the inverter are coupled to the serial connection between the pull-up transistor and the third n-channel transistor.

7. The sense amplifier of claim 5 wherein the main search block further comprises a fourth n-channel transistor, wherein the pull-up transistor and the fourth n-channel transistor are serially connected across the high voltage and ground, wherein the serial connection between the pull-up transistor and the fourth n-channel transistor is coupled to a mid-line of the match line for charging the match line at the mid-line, and wherein a gate of the fourth n-channel transistor is coupled to the a mid-line charging enable signal ("Men_B").

8. The sense amplifier of claim 7 wherein the third n-channel transistor is serially connected across an end of the match line and ground and wherein an input of the inverter is coupled to the end of the match line.

9. The sense amplifier of claim 4 wherein, once the line voltage reaches a trip point voltage of the inverter, the pull-up controller disables charging of the line by the p-channel pull-up transistor.

10. The sense amplifier of claim 9 wherein, when the p-channel pull-up transistor is completely disabled, the line voltage is at a self-calibrated voltage above the trip point voltage of the inverter.

11. The sense amplifier of claim 4 wherein the inverter has a trip point voltage, wherein the line is charged to an overshoot voltage, and wherein the overshoot voltage is above the trip point voltage and below a power supply voltage Vdd.

12. The sense amplifier of claim 3 wherein the timing circuit comprises a first NAND gate, wherein the first NAND gate receives the feedback PMAT_B and an enable signal for input, and wherein the first NAND gate outputs the charge signal Pre_B.

13. The sense amplifier of claim 12 wherein the timing circuit further comprises a second NAND gate, a third NAND gate, a fourth NAND gate, a fifth NAND gate, wherein the enable signal is inputted to the second NAND gate and fourth NAND gate, wherein an inverted main line voltage LMAT_B is inputted to the third NAND gate and the fifth NAND gate, wherein the output of the second NAND gate is inputted to the third and fourth NAND gates, and wherein the output of the third NAND gate is inputted to the second and fifth NAND gates.

14. The sense amplifier of claim 13 wherein, when the fourth NAND gate outputs a high voltage, charging of the main line is stopped and a one-bit mismatch condition is generated for the main line to determine an amount of time needed to sense other main lines.

15. The sense amplifier of claim 14 wherein the fifth NAND gate outputs a match valid signal to the other main lines to latch sensed voltages on the other main lines.

16. A line sense amplifier, comprising:
a presearch block coupled to a presearch line for sensing the presearch line, wherein the presearch block comprises: a presearch controller for setting the presearch line to a voltage state;
and an inverter for sensing the presearch line and for providing a feedback ("PMAT_B") to the presearch controller, wherein the feedback is provided to the main search block and the timing circuit, wherein the presearch controller comprises: a first branch having a first p-channel transistor, a second p-channel transistor, and a first n-channel transistor serially connected across a high voltage and a low voltage; a second branch having a third p-channel transistor, a fourth p-channel transistor, and a fifth p-channel transistor serially connected across the high voltage and the presearch line; and a second n-channel transistor, wherein the first n-channel transistor and the second n-channel transistor are connected in parallel across the presearch line and the low voltage, wherein a main search enable signal ("MSE_B") is coupled to a gate of the fifth p-channel transistor, wherein a charge signal for the presearch line ("Pre_B") is coupled to a gate of the first p-channel transistor, wherein a valid signal is coupled to gates of the second p-channel transistor and the second n-channel transistor, a presearch enable signal ("Pen_B") is coupled to gates of the first n-channel transistor and the third p-channel transistor, and wherein a gate of the fourth p-channel transistor is coupled to the feedback of the presearch block;
a main search block coupled to a main line for sensing the main line, wherein the main search block comprises: a p-channel pull-up transistor for charging the main line; an inverter for inverting a line voltage on the main line; and a pull-up controller, wherein the inverted main line voltage is feedback to the pull-up controller and outputted to provide an indication of the main line voltage; wherein the p-channel pull-up transistor and the inverter are coupled to the main line, wherein the pull-up controller has an output coupled to the gate of the p-channel pull-up transistor, wherein the pull-up controller comprises, a first p-channel transistor having a gate connected to a main search enable signal ("MSE_B"); a second p-channel transistor having a gate connected to an inverted line voltage ("LMAT_B"); a first n-channel transistor having a gate connected to a charge enable signal ("PRE"); and a second n-channel transistor having a gate connected to the inverted line voltage, a third n-channel transistor having a gate connected to the feedback PMAT_B of the presearch block, wherein the first n-channel transistor and the second n-channel transistor are serially connected across a node CM_B and the feedback PMAT_B, wherein node CM_B is coupled to the gate of the p-channel pull-up transistor and ground, wherein the sources of the first and second p-channel transistors are connected to a high voltage state ("VDD"), and wherein the drains of the first and second p-channel transistors are connected to the gate of the p-channel pull-up transistor via the node CM_B; and
a timing circuit to operate the presearch block and the main search block for charging and sensing of the presearch line and the main line, wherein the timing circuit comprises a first NAND gate, wherein the first NAND gate receives the feedback PMAT_B and an enable signal for input, wherein the first NAND gate outputs the charge signal Pre_B, wherein the timing circuit further comprises a second NAND gate, a third NAND gate, a fourth NAND gate, a fifth NAND gate, wherein the enable signal is inputted to the second NAND gate and fourth NAND gate, wherein an inverted main line voltage LMAT_B is inputted to the third NAND gate and the fifth NAND gate, wherein the output of the second NAND gate is inputted to the third and fourth NAND gates, wherein the output of the third NAND gate is inputted to the second and fifth NAND gates, wherein, when the fourth NAND gate outputs a high voltage, charging of the main line is stopped and a one-bit mismatch condition is generated for the main line to determine an amount of time needed to sense other main lines, and wherein the fifth NAND gate outputs a match valid signal to the other main lines to latch sensed voltages on the other main lines.

17. The sense amplifier of claim 16 wherein the pull-up transistor and the third n-channel transistor are serially connected, and wherein the main line and the inverter are coupled to the serial connection between the pull-up transistor and the third n-channel transistor.

18. The sense amplifier of claim 16 wherein the main search block further comprises a fourth n-channel transistor, wherein the pull-up transistor and the fourth n-channel transistor are serially connected across the high voltage and ground, wherein the serial connection between the pull-up transistor and the fourth n-channel transistor is coupled to a mid-line of the match line for charging the match line at the mid-line, wherein a gate of the fourth n-channel transistor is coupled to the a mid-line charging enable signal ("Men_B"), wherein the third n-channel transistor is serially connected across an end of the match line and ground, and wherein an input of the inverter is coupled to the end of the match line.

19. The sense amplifier of claim 16 wherein, once the line voltage reaches a trip point voltage of the inverter, the pull-up controller disables charging of the line by the p-channel pull-up transistor, wherein, when the p-channel pull-up transistor is completely disabled, the line voltage is at a self-calibrated voltage above the trip point voltage of the inverter, wherein the inverter has a trip point voltage, wherein the line is charged to an overshoot voltage, and wherein the overshoot voltage is above the trip point voltage and below a power supply voltage Vdd.

* * * * *